United States Patent
Pitschi et al.

(10) Patent No.: US 7,477,117 B2
(45) Date of Patent: Jan. 13, 2009

(54) SAW FILTER WITH IMPROVED SELECTION OR INSULATION

(75) Inventors: Maximilian Pitschi, Rottach-Egern (DE); Matthias Jungkunz, Munich (DE)

(73) Assignee: EPCOS AG, Munich (DE)

( * ) Notice: Subject to any disclaimer, the term of this patent is extended or adjusted under 35 U.S.C. 154(b) by 287 days.

(21) Appl. No.: 10/559,508

(22) PCT Filed: Apr. 16, 2004

(86) PCT No.: PCT/EP2004/004082

§ 371 (c)(1),
(2), (4) Date: May 26, 2006

(87) PCT Pub. No.: WO2004/109911

PCT Pub. Date: Dec. 16, 2004

(65) Prior Publication Data

US 2007/0279156 A1  Dec. 6, 2007

(30) Foreign Application Priority Data

Jun. 6, 2003 (DE) ............... 103 25 798

(51) Int. Cl.
H03H 9/00 (2006.01)
(52) U.S. Cl. .................. 333/193; 310/313 A
(58) Field of Classification Search ......... 333/193–196; 310/313 A, 313 R
See application file for complete search history.

(56) References Cited

U.S. PATENT DOCUMENTS

| 4,647,881 A | | 3/1987 | Mitsutsuka |
| RE33,957 E | | 6/1992 | Nakazawa et al. |
| 5,929,723 A | * | 7/1999 | Kimura et al. ............... 333/193 |
| 6,147,574 A | * | 11/2000 | Kidoh ........................ 333/195 |
| 6,417,574 B1 | * | 7/2002 | Misawa et al. .............. 257/778 |
| 6,791,437 B2 | | 9/2004 | Hagn et al. |
| 7,154,360 B2 | * | 12/2006 | Wada et al. ................. 333/194 |
| 7,187,101 B2 | * | 3/2007 | Kidoh .................... 310/313 A |

FOREIGN PATENT DOCUMENTS

| DE | 198 18 826 | 11/1999 |
| DE | 100 13 861 | 9/2001 |
| DE | 100 25 450 | 11/2001 |
| EP | 1 158 670 | 11/2001 |

* cited by examiner

Primary Examiner—Don P Le
(74) Attorney, Agent, or Firm—Fish & Richardson P.C.

(57) ABSTRACT

A surface acoustic wave (SAW) filter includes a piezoelectric substrate, and acoustic tracks on the piezoelectric substrate. The acoustic tracks are adjacent and electrically interconnected. The acoustic tracks include electro-acoustic transducers. The electro-acoustic transducers include an input transducer and an output transducer. The SAW filter also includes a shielding structure that is metallic and that is connected to ground. The shielding structure is between the acoustic tracks. The shielding structure shields a first electro-acoustic transducer in a first acoustic track from a second electro-acoustic transducer in a second acoustic track.

20 Claims, 4 Drawing Sheets

SAW FILTER WITH IMPROVED SELECTION OR INSULATION

TECHNICAL FIELD

A SAW filter includes at least one acoustic track in which at least one electro acoustic transducer is positioned. A transducer of this kind has at least two bus bars, which are normally arranged parallel to the direction of propagation of the acoustic surface wave. Perpendicular to each bus bar, are electrode fingers, which form an inter-digital electrode structure.

BACKGROUND

If several tracks of a filter or various tracks of different filters are positioned on a piezoelectric substrate in close proximity to each other, capacitive interaction may arise between the metal plating that forms component structures such as transducers and bus bars, and especially between bus bars positioned perpendicular to the track of two different acoustic tracks. If two acoustic tracks are interconnected and are associated with the same filter, this normally causes the stop-band selection to change. If electromagnetic coupling arises between the acoustic tracks of two independent filters, then this can lead to deterioration in insulation. The effect of this is that unwanted or foreign signal fragments are received by the input of one or the other filter, which affects the actual signal and, therefore, should be avoided. In general, such capacitive interaction is referred to as crosstalk.

If DMS filters are used, the traducers can be positioned in several interconnected tracks. Normally, the acoustic tracks are arranged in parallel for this purpose, and are in close proximity to each other in order to save costly chip surface area. The arrangement may include transducers that are opposite each other and/or bus bars of different tracks in close proximity With input and output transducers, for example, this can lead to significant crosstalk which degrades the filter's selection. This problem arises frequently when the bus bar of the input or output transducer facing a neighboring track is connected to a voltage that is different from ground. Particularly pronounced effects also occur with transducers where the electrical connection of the transducer takes place from one side of the acoustic track, on which the corresponding bus bar is then divided into two sub-bars which are connected to the two terminals. The bus bar located opposite is one piece and is not connected to an externally applied voltage, and therefore assumes a floating voltage (intermediate voltage). If such a transducer, e.g., known from DE 100 13 861 A1 and also known as a v-split transducer, is accessed symmetrically (balanced), then the floating bus bar represents a virtual ground. This means that for a symmetrical connection and otherwise optimized symmetrical design of the remaining filter, the floating voltage is exactly on ground. However, if the voltage of this virtual ground deviates from zero, then symmetry disruption exists, which leads to an impairment of the filter function and results in a lower stop-band selection. This type of "drifting" in the virtual ground of dual track or multiple track DMS filters of this kind may be caused by electromagnetic coupling.

SUMMARY

This application describes placing a shielding component that is connected to ground between two neighboring acoustic tracks of a SAW filter. In this way, it is possible to shield transducers positioned in different tracks against each other, which otherwise would cause crosstalk. If the two tracks belong to the same filter and are electrically interconnected, then this method improves stop-band selection, and as a result, signals within the stop-band are suppressed more effectively. If the transducers that are shielded from each other belong to different filters, then this method improves the insulation between the two filters.

One purpose of the shielding structures is to divert the electromagnetic field lines that cause crosstalk to ground via the metallic shielding structure. A metallic shielding structure is therefore designed as a high-quality ground. For example, at least one, but preferably two or more ground leads, are provided. The quality of the ground can also be improved by increasing the surface area of the shielding structure. It is also possible to increase the thickness of the metal plating on the shielding structure.

The shielding structure provides advantages in a filter in which the transducers to be shielded are designed as v-split transducers with divided bus bars connected to the terminals with continuous bus bars floating. With a filter of this kind—without the shielding structure—increased crosstalk can result, because the distance to the neighboring tracks is reduced due to a missing connection on the floating bus bar.

The shielding structure may include a continuous metal plated surface, which extends at least along the length of the transducers to be shielded against each other. Because the quality of the ground also increases with the surface area of the shielding structure, the width of the shielding structure perpendicular to the acoustic track is selected as large as possible. For a given distance of the acoustic tracks, the available surface between the tracks is thereby filled with the shielding structure. The distance between the tracks may be increased additionally compared with an unshielded filter in order to make room for a high quality shielding structure. The resulting increased surface area required for the filter, which in effect represents a disadvantage, is compensated by the improved stop-band selection or the improved insulation.

In one embodiment, the filter is designed as a DMS filter, which has a first transducer acting as an input transducer and a first coupling transducer in the first track, and, in contrast, a second coupling transducer and a second transducer acting as an output transducer in the second track. In addition, any number of additional transducers acting as input, output, or coupling transducers can be provided in each track. The two acoustic tracks are connected via coupling lines which are connected to one bus bar from the first coupling transducer and one bus bar from the second coupling transducer, respectively. The shielding structure is positioned between the input transducer of the first track and the output transducer of the second track, i.e., between the first and second transducer.

The shielding structure also may be connected to the bus bar of a corresponding coupling transducer that is opposite the bus bar that is connected to the coupling line. To be precise, these are the bus bars facing the corresponding opposite track of the coupling transducers. Because, in this arrangement, the coupling line is connected to the outward-facing bus bar of the coupling transducers; the coupling line may be routed outside the acoustic track or around the corresponding track. Because each acoustic track of a DMS filter may be delimited by two reflectors, the coupling line may be routed behind the reflectors of each track.

It is also possible, however, to integrate the reflectors into the coupling line and therefore transmit the signal through the reflectors. This design is especially space saving, because this means that the reflectors are used for signal transmission and no additional circuit is required.

In a further embodiment, the shielding structure is connected to the reflectors. This makes it possible to make the ground connection of the shielding structure available via the reflectors and it is therefore possible to connect the reflectors to a ground separately. However, it is also possible to connect only the shielding structures to a ground and then connect the reflectors to the shielding structures. On the other hand, both the reflectors and the shielding structures can be connected to a ground.

The shielding structure may be manufactured on the substrate together with the other metal-plated structures and therefore advantageously has the same construction. If different metal-plating steps are required for other reasons, then the shielding structure can also have a combined multiple metal-plated structure and, in particular, may be constructed in such a way that it is thicker than the metal plating used for the transducers, reflectors, or bus bars. It can therefore be manufactured in the same step with other metal-plated structures and therefore does not require additional expenditure for processing.

Suitable metal plating for transducers and therefore potential components for the metal plating for the shielding structure are, for example, aluminum, an alloy containing aluminum, or a multiple-layer composition which contains at least one layer of aluminum or an aluminum alloy. Additional layers for improving adhesion can be provided between the metal plating and the substrate surface. A passivation layer may be provided above the metal plating. A passivation layer of this type can be an additionally applied dielectric layer, for example a thin layer of $SiO_2$. However, it is also possible to oxidize the uppermost layer of the metal plating and therefore the uppermost layer of both the transducers and the shielding structures. This can be done, for example by transferring the uppermost layer into the corresponding oxides. Metal plating that includes aluminum may be covered with a passivation layer of aluminum oxide. This can be accomplished through anodic oxidization or via a suitable plasma treatment of the original metal plating in a plasma containing oxygen.

Furthermore, it is possible to provide additional reinforcement for the bus bars and/or solderable connecting surfaces or under bump metal plating and the shielding structure can also be reinforced in this process.

The connections for the metallic structures of the filter and therefore the connections for the shielding structure, the transducers, and if applicable, other parts of the filter can be implemented using bonding wire. However, a flip chip arrangement is preferred, especially for miniaturized components, whereby the piezoelectric substrate that carries the filter structures is connected to a carrying substrate using bump connections so that the component structures face towards the carrying substrate, and the electrical connecting surfaces that are to be interconnected end up facing each other directly and can then be connected with bumps.

The following detailed description shows examples of designs and corresponding diagrams. The diagrams are for demonstration purposes and are therefore only schematic and are not drawn to scale. The number of components shown and the dimensions of the components, especially the electrode fingers, deviate from that of a real filter.

DESCRIPTION OF THE DRAWINGS

Diagram 1 shows a 2-track DMS filter with shielding structure.

Diagram 2 shows a 2-track DMS filter where the shielding structure is connected to the ground terminals of the coupling transducers.

Figure 1:
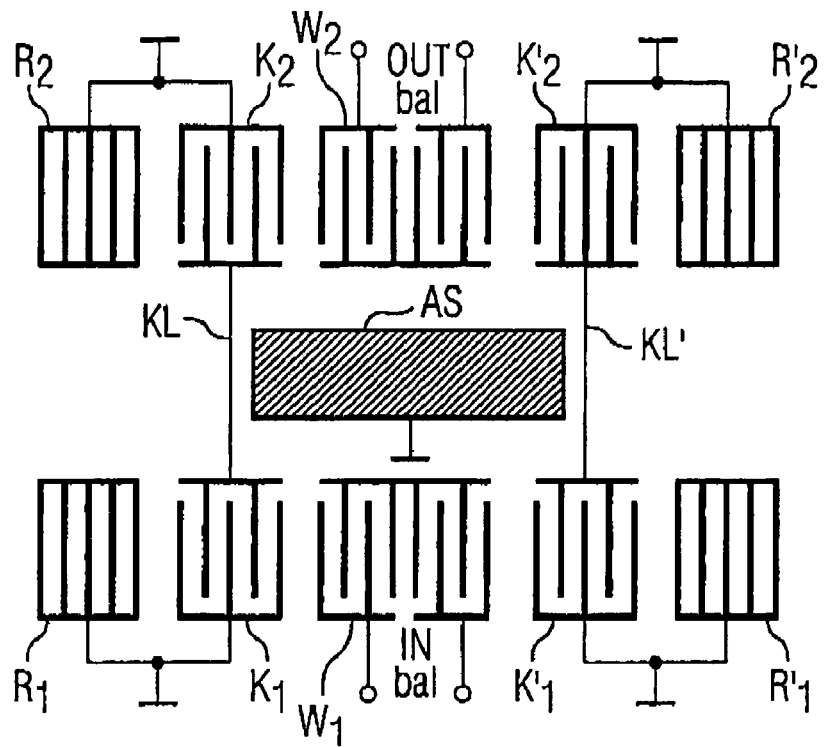
Figure 2:
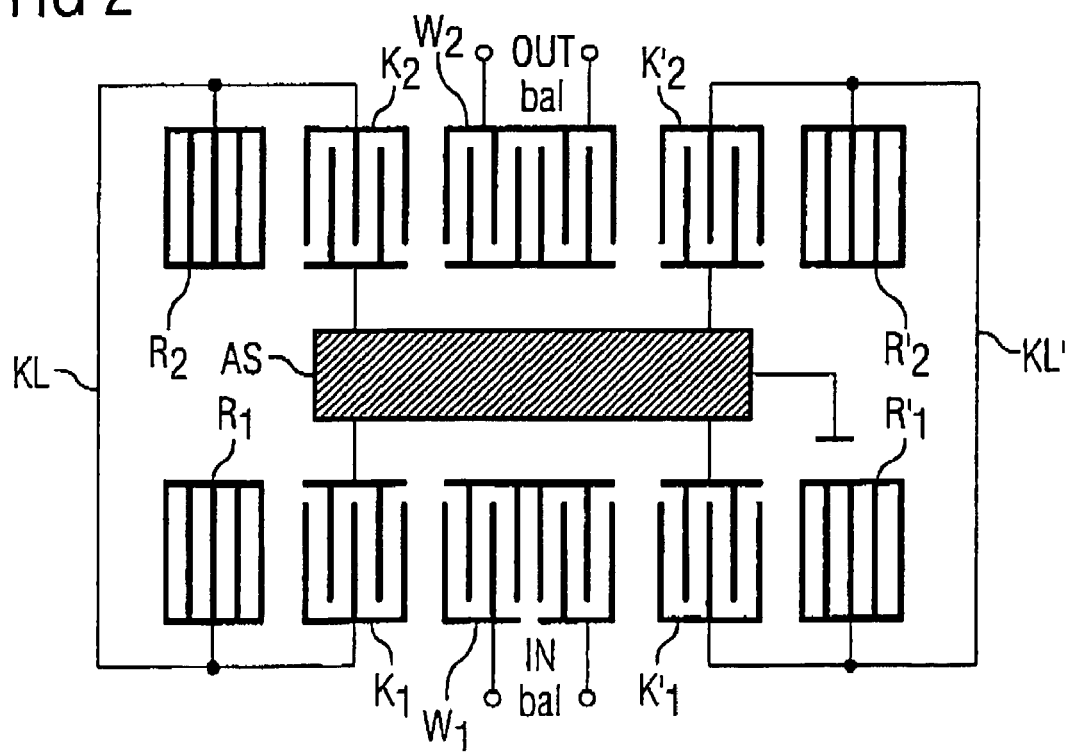
Figure 3:
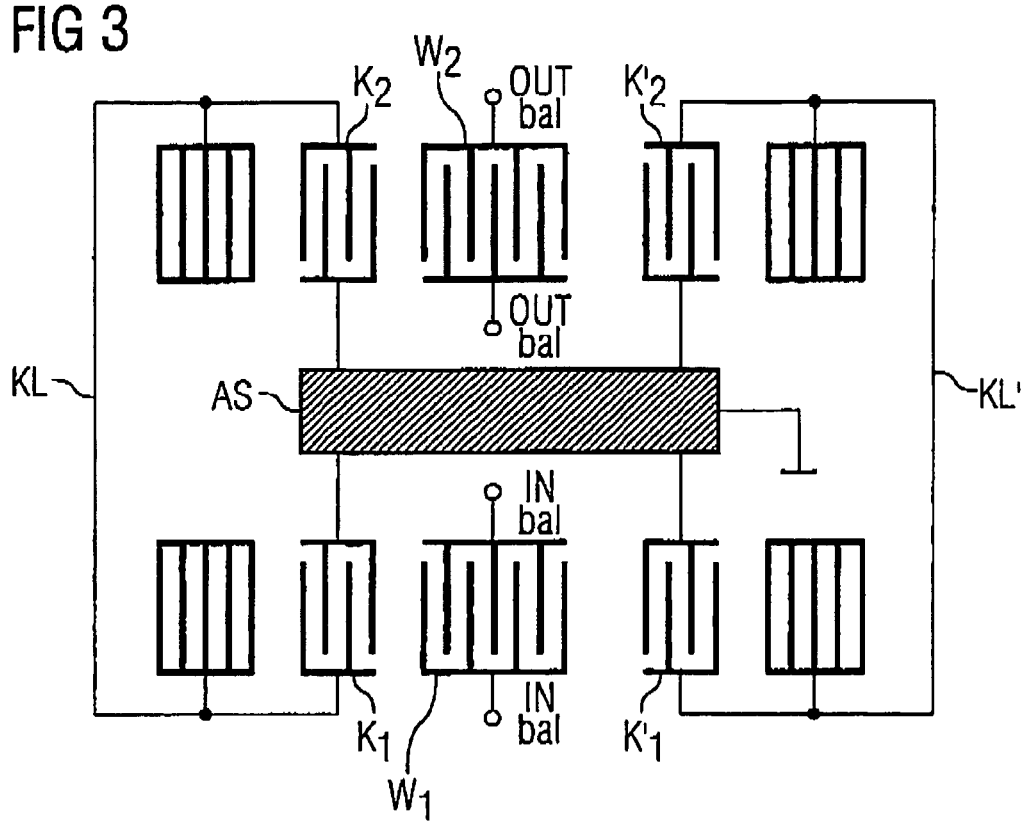
Figure 4:
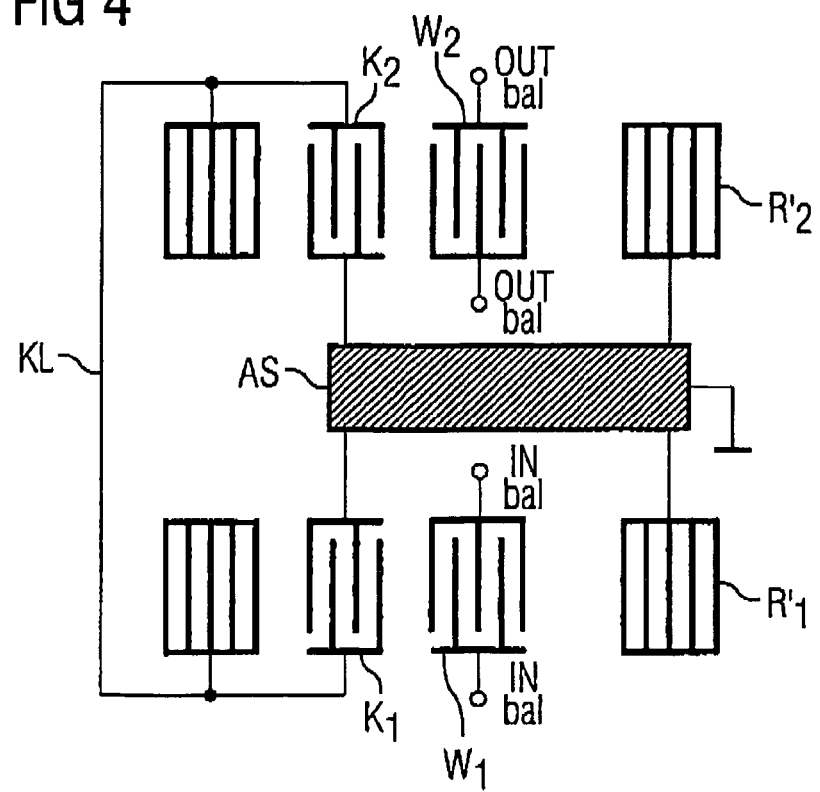
Figure 5:
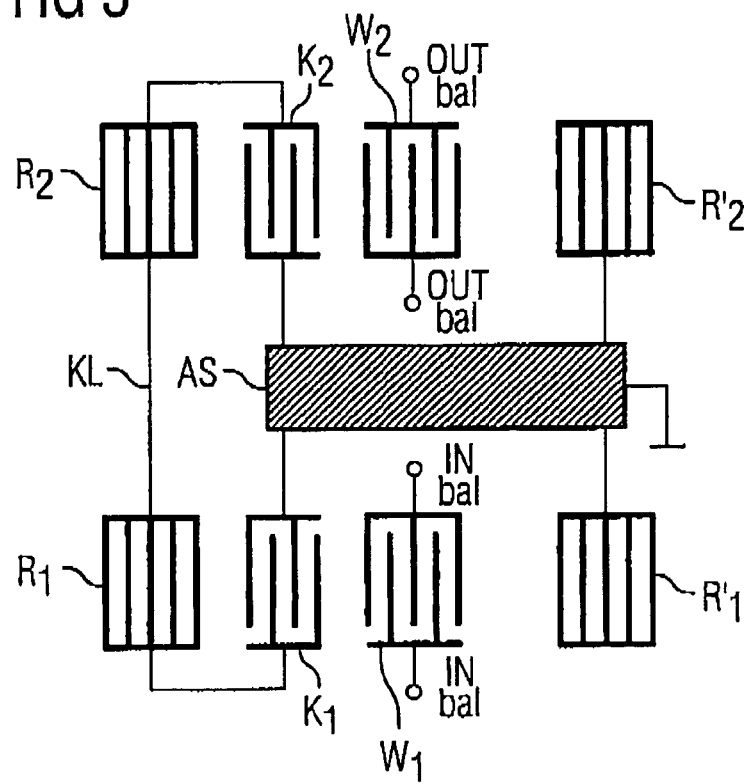
Figure 6:
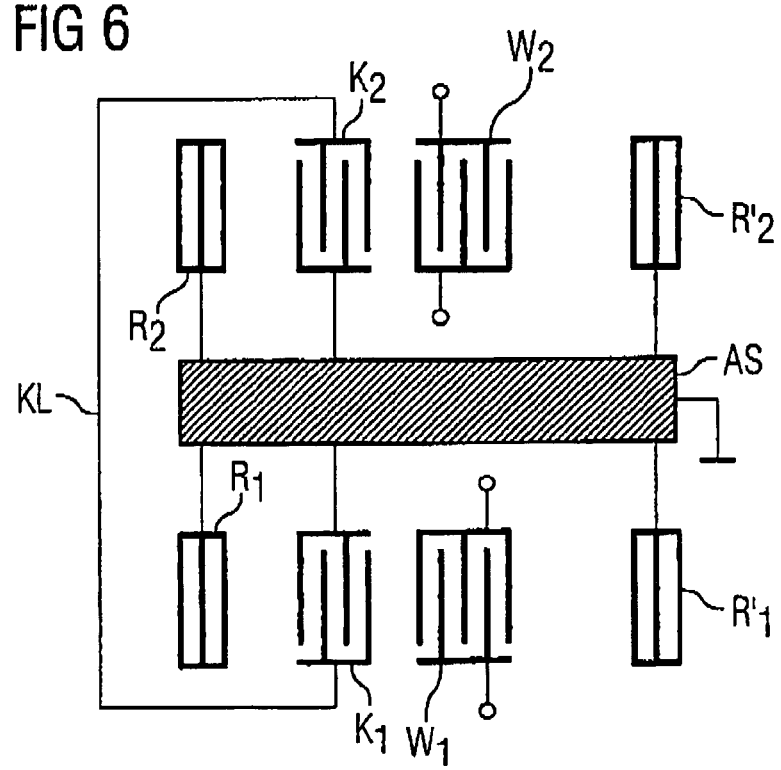
Figure 7:
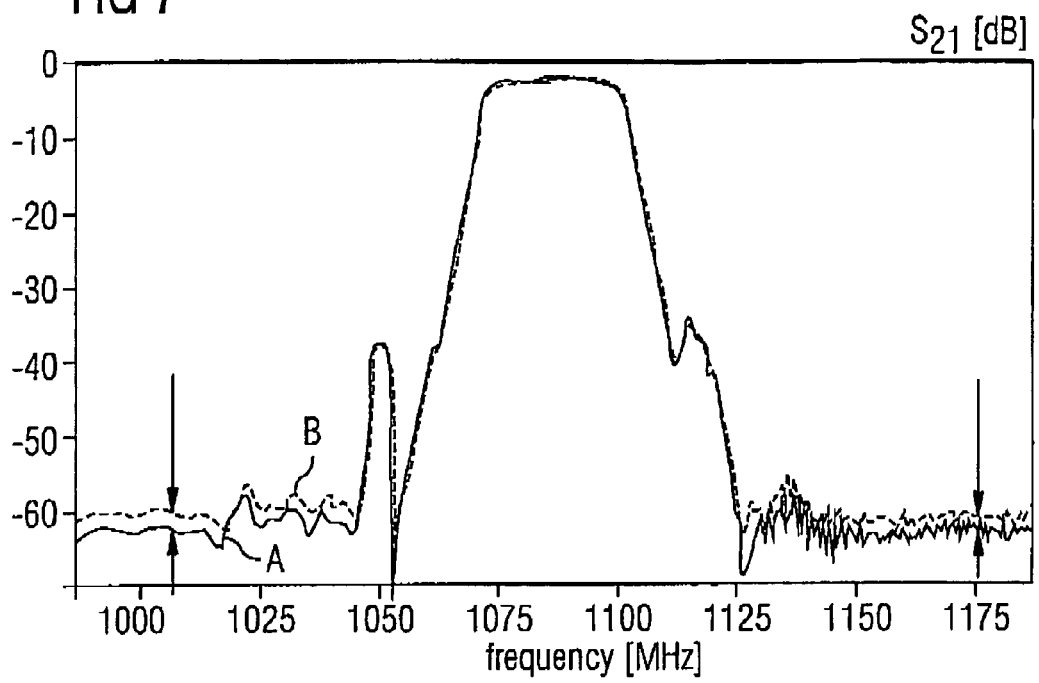
Figure 8:
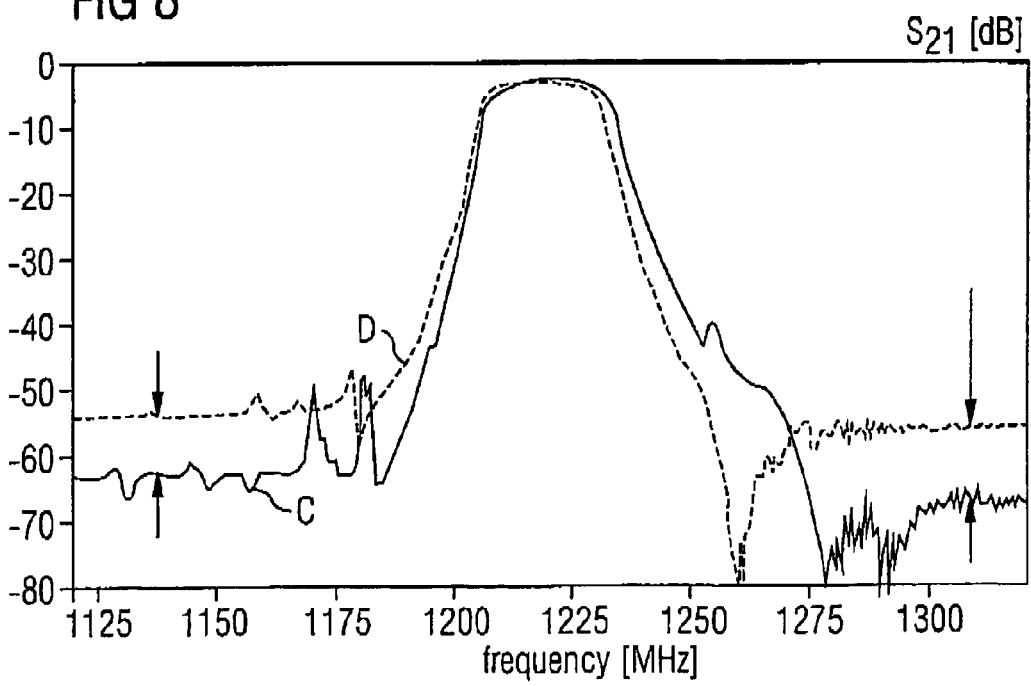

Diagram 3 shows a 2-track DMS filter with unsplit input and output transducer.

Diagram 4 shows a 2-track DMS filter with two transducers for each track and unsplit input and output transducers.

Diagram 5 shows a 2-track DMS filter with an interconnecting variation.

Diagram 6 shows a 2-track DMS filter with an additional interconnecting option.

Diagram 7 shows the outlet behavior of a filter compared with that of a known filter.

Diagram 8 shows the outlet behavior of a further improved filter compared with that of a known filter.

DETAILED DESCRIPTION

Diagram 1 shows an initial simple design for a 2-track 3-transducer DMS filter. In the first track (shown in the diagram below), a first transducer W1 is positioned, connected to the input IN via two terminals and therefore serving as an input transducer. A first coupling transducer K1 and an additional coupling transducer K1' are positioned at both sides of the first transducer W1.

The second acoustic track includes a second transducer W2, which is connected to the output (OUT) and represents the output transducer. On both sides, the second transducer W2 in the second track is adjoined by a second coupling transducer K2, K2', respectively. The first and second coupling transducers K1, K2; K1', K2' are connected to each other via coupling lines KL, KL'. Each track is bordered on both sides by one reflector R1, R1', R2, R2', respectively. Input and output transducers (first and second transducer) W1, W2 are designed as v-split transducers here and are operated symmetrically (balanced). However, it is also possible to operate one or both of the first and second transducers asymmetrically and to place one of the terminals on zero or reference voltage (ground) for that purpose. Between the two tracks, a shielding structure AS is designed as a flat piece of metal plating. Here the shielding structure AS extends at least along the distance determined parallel to the acoustic track between the first and second transducers which are to be shielded against each other. The width of the shielding structure determined perpendicular to the acoustic track is much higher than that of the bus bars of the transducers and is optimized for the distance between the two tracks, that is, it optimally fills this distance. The shielding structure is connected to ground. As a further design in this diagram, that bus bar of each coupling transducer K1, K2 which is not connected to a coupling line KL, together with the directly neighboring reflector R, is connected to a ground.

Diagram 2 shows an additional design in which the coupling lines KL, KL' are connected to those bus bars of the coupling transducers K which face away from the corresponding opposite track, that is to say, are the furthest away from the corresponding opposite track.

In this way, the shielding structure positioned between the tracks borders only such bus bars or structures that are actually or virtually connected to ground. In addition, the bus bars of the coupling traducers K which are to be connected to ground are connected to the shielding structure AS. The first and second coupling transducers K1 and K2 are connected via a coupling line KL, which is routed around the reflectors R1, R2. The same applies to the coupling line KL', which is routed around the reflectors R1', R2'. In this design, the reflectors are connected to the corresponding neighboring coupling lines. However, it is also possible to connect the reflectors to ground or design them as floating.

Diagram 3 shows an additional design. In contrast to the design in accordance with diagram 2, the first transducer W1 and second transducer W2 are normal transducers with continuous bus bars on both sides of the acoustic track. The terminals of the first and second transducer are provided on two bus bars on both sides of the acoustic track. In this design, the input and output transducers W1, W2 are symmetrical transducers for balanced operation. The remaining design of the filter is unchanged compared with the design in accordance with diagram 2. In this design the shielding structure AS does not divide a floating bus bar in each of the two transducers W1 and W2, but rather the inner symmetrical terminals of the first and second transducers W1, W2.

Diagram 4 shows a 2-track DMS transducer where each track has two transducers, a first transducer and a first coupling transducer in the first and a second transducer and a second coupling transducer in the second track. The first and second transducers have their terminals on both sides of the transducer. The coupling transducers K1, K2 are connected via a coupling line KL, which is connected to the outward facing bus bar of the coupling transducers, respectively, and is routed around the two directly neighboring reflectors.

The inner bus bars of the coupling transducers K1, K2 are connected to the shielding structure, as well as the reflectors R1', R2' positioned directly beside the first and second transducers W1, W2.

Diagram 5 shows an additional variation on the design shown in diagram 4. In this design the coupling line is routed directly through the two directly neighboring reflectors R1, R2. Compared with the design in diagram 4, this saves a conductor section of the coupling line, the function of which is hereby performed by the two reflectors.

Diagram 6 shows an additional variation on the design shown in diagram 4, whereby the coupling line is still routed around the two reflectors R1, R2. However, in contrast to diagram 4 the reflectors R1, R2 here are not connected to the coupling line KL, but are connected to the shielding structure AS. For this purpose the shielding structure is extended and separates all transducers and reflectors of the two tracks from each other.

In diagram 7, the frequency response of a filter in accordance with the designs described herein is shown and contrasted with the frequency response of a known filter without a shielding structure. The frequency response A of a 3-transducer 2-track DMS filter that is designed in accordance with diagram 1 is compared with the frequency response B of a corresponding filter without shielding structure AS. It turns out that the filter (measured by the transmission function S21) exhibits an improved stop-band selection; see for example the difference between the two transmission functions at the locations of the stop-band marked with arrows.

Diagram 8 shows, in comparison, the frequency response C of a filter designed in accordance with diagram 2, which is contrasted here with the frequency response D of a corresponding filter without a shielding structure. It follows that with an enlarged shielding structure compared with a filter in accordance with diagram 1 and with coupling lines routed on the outside an additional improvement of the stop-band selection can be achieved, while the pass-band, being the transmission range of the filter, remains largely unchanged. In particular, the input attenuation and the bandwidth remain nearly the same.

The invention is not limited to the embodiments described herein, including DMS filters. Additional possibilities for variation include variations of the structure, especially the number of transducers per track. The shielding of transducers in the tracks of a reactance filter is also possible. Additional variations arise from connecting the transducers and coupling transducers, as well as omitting the connections, so that embodiments may be constructed using two tracks that are electrically insulated against each other.

Instead of the normal finger transducers shown in the design examples, the transducers can also be designed as split-finger transducers, weighted transducers, distributed transducers, and especially as SPUDT transducers. In addition, the distances and/or the widths of the electrode fingers along an axis perpendicular to the propagation direction of the surface wave can change, so that the corresponding transducer is designed as a fan transducer. Also, filters described herein can have transducers with electrode finger distances and/or widths that change in the propagation direction.

A filter in accordance with the designs described herein can also comprise a first and second track, which are embodied in one of the filters of a double so-called 2-in-1 filter encased in one housing. The two tracks can also be assigned to the two sub-filters of a duplexer, so that one track is assigned to an RX filter and the other track is assigned to a TX filter. In the case of a reactance filter, the two acoustic tracks or the resonators, as the case may be, are shielded against each other, and the resonators from different branches are preferably shielded against each other by means of a shielding structure. For example, a resonator in the serial branch can be shielded against a directly neighboring resonator in the next acoustic track in the parallel branch. In this way, improved insulation is maintained, which in this case can be noticeable in the filter as a whole through improved stop-band selection.

The invention claimed is:

1. A surface acoustic wave filter comprising:
   a piezoelectric substrate;
   acoustic tracks on the piezoelectric substrate, the acoustic tracks being adjacent and electrically interconnected, the acoustic tracks comprising electro-acoustic transducers, the electro-acoustic transducers comprising an input transducer and an output transducer; and
   shielding structure that is metallic and that is electrically connected to ground, the shielding structure being between the acoustic tracks, the shielding structure shielding a first electro-acoustic transducer in a first acoustic track from a second electro-acoustic transducer in a second acoustic track,
   wherein the first acoustic track and the second acoustic track are in parallel such that respective surface acoustic wave propagation directions of the first acoustic track and the second acoustic track are parallel to each other.

2. The surface acoustic wave filter of claim 1, wherein the first and second electro-acoustic transducers each have a bus bar facing the shielding structure, and wherein at least one bus bar facing the shielding structure is electrically floating or electrically connected to a voltage other than ground.

3. The surface acoustic wave filter of claim 1, wherein the first electro-acoustic transducer, the second electro-acoustic transducer, and the shielding structure are made of a same metal plating.

4. The surface acoustic wave filter of claim 3, wherein the metal plating comprises a layer of aluminum or an alloy containing aluminum, or a multiple-layer composition that contains at least one layer of aluminum or of an aluminum alloy.

5. The surface acoustic wave filter of claim 1, further comprising:
a carrier on which the piezoelectric substrate is mounted in a flip-chip arrangement; and
an electrically-conducting connection between a connecting surface on the carrier and the shielding structure, the electrically-conducting connection comprising one or more bumps.

6. The surface acoustic wave filter of claim 1, wherein the shielding structure is at least along an entire length of the first and second electro-acoustic transducers.

7. The surface acoustic wave filter of claim 1, wherein the shielding structure has a width that is larger than facing bus bars of the first and second electro-acoustic transducers.

8. A DMS filter comprising the surface acoustic wave filter of claim 1, wherein the first electro-acoustic transducer comprises the input transducer and the second electro-acoustic transducer comprises the output transducer, the DMS filter further comprising:
a first coupling transducer in the first acoustic track, the first coupling transducer comprising a first bus bar;
a second coupling transducer in the second acoustic track, the second coupling transducer comprising a second bus bar; and
a coupling line that electrically connects the first and second bus bars;
wherein the shielding structure between the first electro-acoustic transducer and the second electro-acoustic transducer.

9. The DMS filter of claim 8, wherein the first bus bar comprises a bus bar of the first coupling transducer that is furthest from the second acoustic track, and the second bus bar comprise a bus bar of the second coupling transducer that is furthest from the first acoustic track.

10. The DMS filter of claim 9, further comprising:
reflectors that sandwich the acoustic tracks;
wherein the coupling line extends around the reflectors outside the acoustic tracks.

11. The DMS filter of claim 8, wherein the shielding structure is electrically connected to an external ground and to a bus bar of a coupling transducer that is not connected to the coupling line.

12. The DMS filter of claim 8, wherein the first electro-acoustic transducer comprises a first outer bus bar and the second electro-acoustic transducer comprises a second outer bus bar, the first outer bus bar comprising a bus bar of the first electro-acoustic transducer that is furthest from the second acoustic track, and the second outer bus bar comprising a bus bar of the second electro-acoustic transducer that is furthest from the first acoustic track, the first outer bus bar comprising first and second sub-bars, the second outer bus bar comprising third and fourth sub-bars, the first and second sub-bars being electrically connected to first and second input terminals, respectively, and the third and fourth sub-bars being electrically connected to first and second output terminals, respectively; and
wherein the first electro-acoustic transducer and the second electro-acoustic transducer operate symmetrically.

13. The surface acoustic wave filter of claim 1, further comprising:
reflectors that border the acoustic tracks;
wherein the shielding structure is electrically connected to an external ground and to the reflectors.

14. A surface acoustic wave filter comprising:
a piezoelectric substrate;
acoustic tracks on the piezoelectric substrate, the acoustic tracks being adjacent and electrically interconnected, the acoustic tracks comprising electro-acoustic transducers, the electro-acoustic transducers comprising an input transducer and an output transducer; and
shielding structure that is metallic and that is electrically connected to ground, the shielding structure being between the acoustic tracks, the shielding structure shielding a first electro-acoustic transducer in a first acoustic track from a second electro-acoustic transducer in a second acoustic track; and
reflectors that border the acoustic tracks;
wherein the shielding structure is electrically connected to an external ground and to the reflectors.

15. A DMS filter comprising:
a surface acoustic wave filter comprising:
a piezoelectric substrate;
acoustic tracks on the piezoelectric substrate, the acoustic tracks being adjacent and electrically interconnected, the acoustic tracks comprising electro-acoustic transducers, the electro-acoustic transducers comprising an input transducer and an output transducer; and
shielding structure that is metallic and that is electrically connected to ground, the shielding structure being between the acoustic tracks, the shielding structure shielding a first electro-acoustic transducer in a first acoustic track from a second electro-acoustic transducer in a second acoustic track,
wherein the first electro-acoustic transducer comprises the input transducer and the second electro-acoustic transducer comprises the output transducer, the DMS filter further comprising:
a first coupling transducer in the first acoustic track, the first coupling transducer comprising a first bus bar;
a second coupling transducer in the second acoustic track, the second coupling transducer comprising a second bus bar; and
a coupling line that electrically connects the first and second bus bars;
wherein the shielding structure is between the first electro-acoustic transducer and the second electro-acoustic transducer.

16. The DMS filter of claim 15, wherein the first bus bar comprises a bus bar of the first coupling transducer that is furthest from the second acoustic track, and the second bus bar comprise a bus bar of the second coupling transducer that is furthest from the first acoustic track.

17. The DMS filter of claim 16, further comprising:
reflectors that sandwich the acoustic tracks;
wherein the coupling line extends around the reflectors outside the acoustic tracks.

18. The DMS filter of claim 15, wherein the shielding structure is electrically connected to an external ground and to a bus bar of a coupling transducer that is not connected to the coupling line.

19. The DMS filter of claim 15, wherein the first electro-acoustic transducer comprises a first outer bus bar and the second electro-acoustic transducer comprises a second outer bus bar, the first outer bus bar comprising a bus bar of the first electro-acoustic transducer that is furthest from the second acoustic track, and the second outer bus bar comprising a bus bar of the second electro-acoustic transducer that is furthest from the first acoustic track, the first outer bus bar comprising first and second sub-bars, the second outer bus bar comprising third and fourth sub-bars, the first and second sub-bars being electrically connected to first and second input terminals, respectively, and the third and fourth sub-bars being electrically connected to first and second output terminals, respectively; and wherein the first electro-acoustic transducer and the second electro-acoustic transducer operate symmetrically.

20. The DMS filter of claim 15, wherein the first acoustic track and the second acoustic track are arranged in parallel such that respective surface acoustic wave propagation directions of the first acoustic track and the second acoustic track are parallel to each other.

* * * * *